United States Patent
Powers et al.

(10) Patent No.: US 6,796,480 B1
(45) Date of Patent: Sep. 28, 2004

(54) RELIABILITY OF HEAT SINK MOUNTED LASER DIODE BARS

(75) Inventors: Jeffrey Powers, Tucson, AZ (US); Nicolo Sciortino, Sahuarita, AZ (US)

(73) Assignee: Spectra-Physics, Tucson, AZ (US)

( * ) Notice: Subject to any disclaimer, the term of this patent is extended or adjusted under 35 U.S.C. 154(b) by 0 days.

(21) Appl. No.: 10/406,024

(22) Filed: Apr. 3, 2003

(51) Int. Cl.[7] .................. B23K 31/12; B23K 35/12; B23Q 15/00

(52) U.S. Cl. .................. 228/103; 228/251; 228/252; 228/7; 228/9; 228/41

(58) Field of Search .................. 219/121.6, 121.64, 219/121.66; 228/103, 212, 245, 246, 249, 251, 252, 7, 9, 41

(56) References Cited

U.S. PATENT DOCUMENTS

| | | | | |
|---|---|---|---|---|
| 4,832,251 A | * | 5/1989 | Hawrylo | 228/105 |
| 5,422,905 A | * | 6/1995 | Andrews | 372/50 |
| 5,745,514 A | * | 4/1998 | Patel et al. | 372/43 |
| 5,828,683 A | * | 10/1998 | Freitas | 372/36 |
| 5,848,082 A | * | 12/1998 | Shum | 372/36 |
| 5,883,748 A | * | 3/1999 | Shum | 359/819 |
| 5,909,458 A | * | 6/1999 | Freitas et al. | 372/36 |
| 6,295,753 B1 | * | 10/2001 | Thummel | 42/116 |
| 6,370,173 B1 | * | 4/2002 | Martin | 372/36 |
| 6,563,696 B1 | * | 5/2003 | Harris et al. | 361/619 |
| 6,633,599 B2 | * | 10/2003 | Murray et al. | 372/75 |
| 6,647,035 B1 | * | 11/2003 | Freitas et al. | 372/36 |
| 6,730,993 B1 | * | 5/2004 | Boyer et al. | 257/675 |

* cited by examiner

*Primary Examiner*—Steven Bos
*Assistant Examiner*—Colleen P. Cooke
(74) *Attorney, Agent, or Firm*—Howard R Popper

(57) ABSTRACT

A laser diode bar, solder preform and heat sink are assembled prior to reflowing the solder in a manner to prevent molten solder from being drawn by capillary action over the light emitting end of the diode bar. A recessed pin 30 locates the ends of the laser bar and solder preform with respect to an edge of the heat sink so that the laser bar and solder preform overhang the heat sink edge by respective amounts. When molten, the solder will not be drawn by capillary action to obscure the light emitting end of the laser diode bar.

8 Claims, 2 Drawing Sheets

RELIABILITY OF HEAT SINK MOUNTED LASER DIODE BARS

FIELD OF THE INVENTION

This invention relates to laser diode bars mounted on heat sinks and, more particularly, to avoiding the introduction of defects when soldering laser diode bars to heat sinks.

BACKGROUND OF THE PRIOR ART

It is current practice to solder laser diode bars to copper heat sinks, sometimes using an intermediate layer of CuW between the diode bar and the heat sink. Because of the wide angle of emission, it is also current practice to mount the emitting edge of the laser bar at the very edge of the heat sink so that none of the emerging rays are blocked. In the soldering operation, the laser diode bar is placed on a solder preform of AuSn atop the heat sink The assembly is aligned at the emitting edge of the laser bar using a planar datum, clamped together and placed in an oven to reflow the solder Because of the small dimensions involved, the molten solder is liable to flow by capillary action up and over the emitting face of the laser bar, spoiling the light emission from the diode. It would be of great advantage to improve the soldering of laser bars to heat sinks by preventing such unwanted solder overrun.

SUMMARY OF THE INVENTION

In accordance with the invention, a laser diode bar, solder preform and heat sink are assembled prior to reflowing the solder in a manner to prevent molten solder from being drawn by capillary action over the light emitting end of the diode bar. A pair of recessed alignment pins 37 establish a datum that locates the emitting end of the laser bar, solder preform and an edge of the heat sink without contacting the emitting surface of the laser bar. Advantageously, the recesses in the alignment pins allow the laser bar and solder preform to overhang the heat sink edge by respective amounts. When molten, the solder will not be drawn by capillary action to obscure the light emitting end of the laser diode bar.

BRIEF DESCRIPTION OF THE DRAWING

The foregoing and other objects and features of the present invention may become more apparent from a reading of the ensuing description together with the drawing in which.

DESCRIPTION

Figure 1:
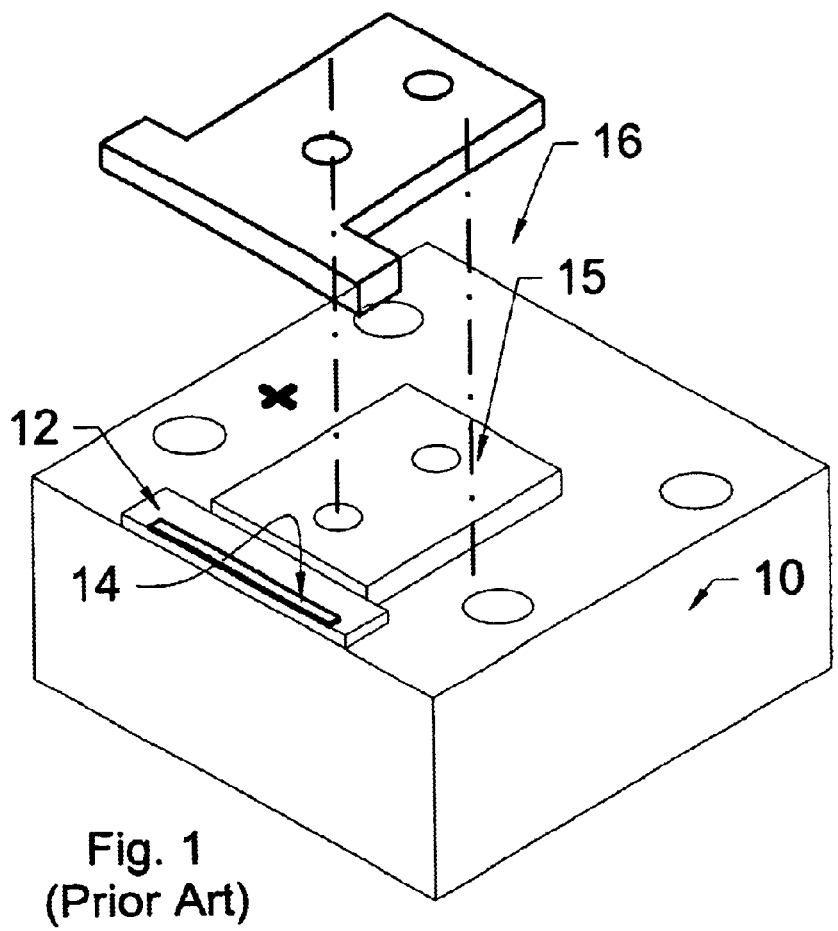
FIG. 1 is an isometric view of a prior art laser diode bar mounted on a heat sink.

Referring now to prior art FIG. 1, a laser diode bar 14 and submount 12 are soldered to a massive heat sink 10. Laser diode bar 14 typically has a thickness of only 0.005" and submount 12, typically made of copper tungsten (CuW) is used to minimize mechanical stress on bar 14 which arises because the thin laser diode bar has a thermal coefficient of expansion (CTE) of about 6 ppm while copper block 10 has a CTE of 16 ppm. A CuW submount 12 which has a CTE similar to that of the laser diode bar. An insulating standoff 15 separates electrode 16 from block 10. Wires conventionally used to connect electrode 16 to laser diode bar 14 are omitted for clarity.

Figure 2:
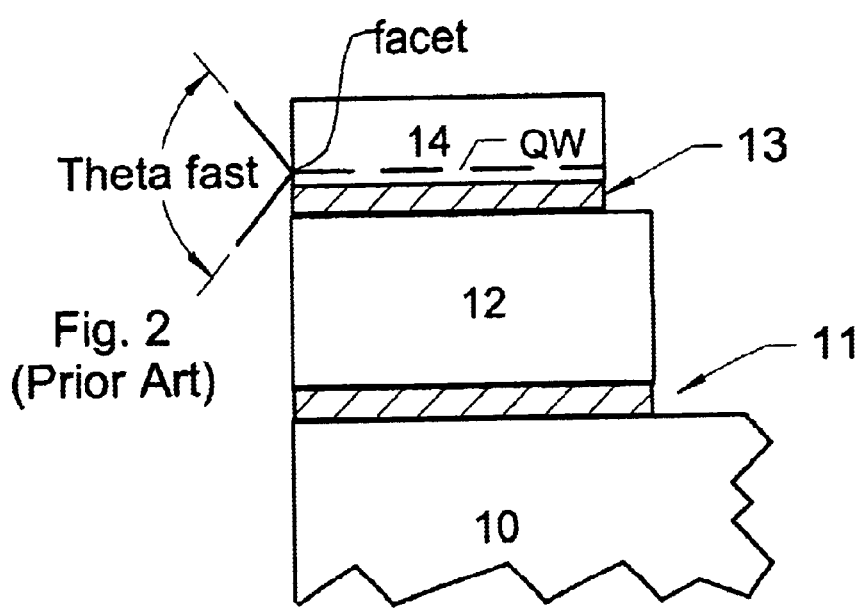
FIG. 2 is an idealized side view of the configuration of FIG. 1.

An idealized side view of the assembly is shown In FIG. 2. A solder layer 13 secures laser diode bar 14 to submount 12 and a solder layer 11 secures submount 12 to heat sink block 10. The emitting facet of the laser bar is aligned to the solder preform and the end of the heat sink using a planar datum (not shown). It is customary to use solder in the form of sheets called preforms which are melted when the assembly is placed in an oven to reflow the solder. It should be noted that laser diode bar 14 is soldered so that the diode surface closest to its quantum well layer QW adjoins heat sink 10. Typical solder preforms may be an 80/20 AuSn or an In alloy.

When the assembly is connected to a source of electrical power, the emitting facet at the (left-hand) emitting end of quantum well layer QW radiates a beam of laser light that diverges along a "fast axis" and a "slow axis", the angle "theta fast" of the fast axis being depicted. Ideally, the laser diode facet should be aligned flush with the end of submount 12 and solder preform 13 so that no part of the emitted rays are intercepted or obscured by the submount or solder. To achieve such an alignment, laser diode bar 14, solder preform 13, submount 12, solder preform 11 and heat sink 10 may be placed in a jig so that their left-hand ends are butted against one or more cylindrical alignment pins (not shown). Unfortunately even when properly aligned for the solder reflow operation the molten solder may be drawn by capillary action between the surfaces of the alignment pins and the facet at the emitting end of the laser bar's QW layer, blocking some or all of the laser bar's light output The height of undesired solder rise by capillary flow up the emitting facet is determined by several factors, and may be expressed as:

$$h = \frac{2\gamma_{lv}\cos\theta}{\rho g d},$$

where $\gamma_{lv}$ is the liquid-vapor surface energy;

$\theta$ is the contact angle;

$\rho$ is the density of the molten solder;

g is the acceleration of gravity; and d is the separation between the surfaces of the alignment pin and the laser bar facet.

Figure 3:
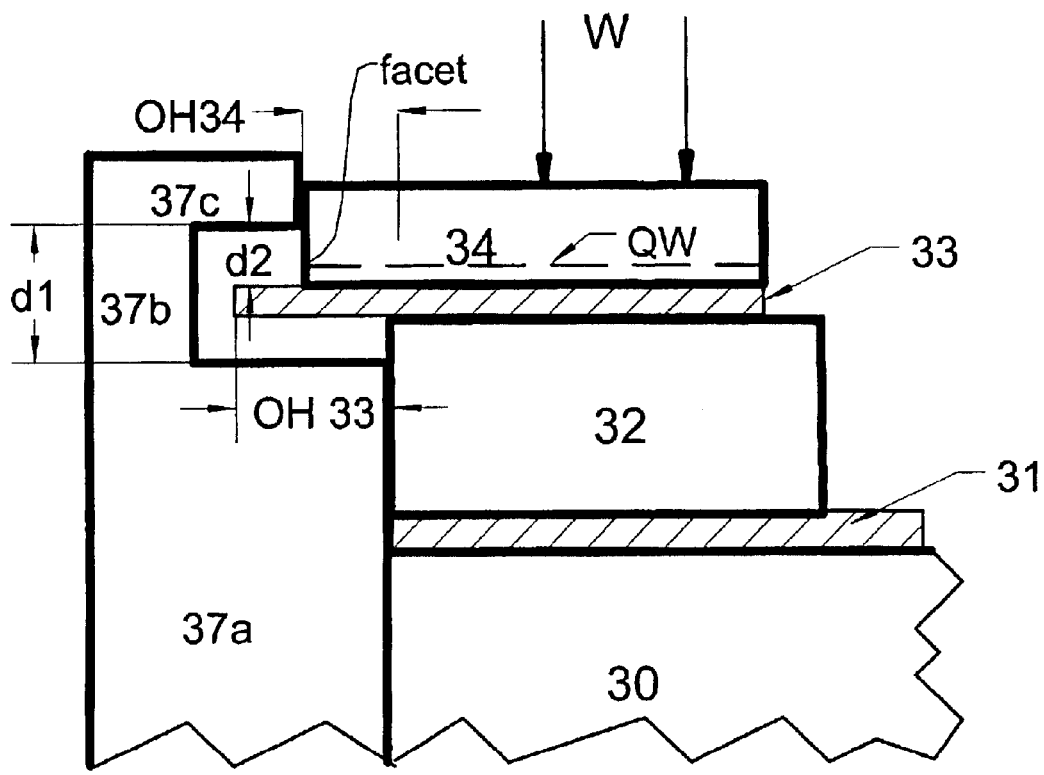
FIG. 3 shows the preferred method of aligning a laser diode bar and heat sink in accordance with the invention.
Figure 4:
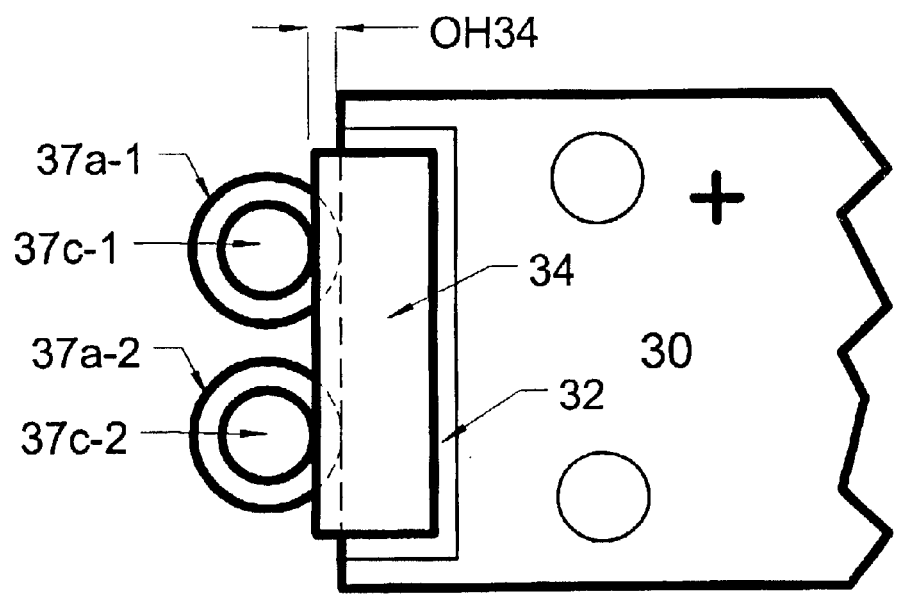
FIG. 4. is a top view corresponding to FIG. 3.

To prevent such capillary action by the reflowed molten solder, the arrangement of FIGS. 3 and 4 is used. FIG. 3 is a side view and FIG. 4 is a top view of a heat sink 30, a first solder preform 31, a submount 32, a second solder preform 33 and a laser diode bar 34 aligned for soldering in accordance with the invention. Laser diode bar 34 is placed on solder preform 33 so that its quantum well layer QW is closest to preform 33.

Proper alignment for avoiding capillary action is achieved with the aid of a pair of polished alumina (Al2O3) alignment pins 37-1 and 37-2. Alignment pins 37 exhibit three different diameters, 37a, 37b and 37c. It should be noted that this invention teaches that rather than attempting to flush align the end of laser bar 21 with the end of heat sink block 20, as in the idealized but unachievable alignment depicted in FIG. 2, the alignment pins 37 create a condition where laser bar 34 is deliberately allowed to overhang the ends of heat sink 30 and submount 32 by a minute amount, identified in FIGS. 3 and 4 as "OH 34". Also, the solder sheet or preform 33 is allowed to overhang the end of heat sink block 30 by a small amount identified as "OH 33" in order to ensure that the solder, when melted, will flow to the end of bar 34 closest to the emitting end. The solder at the end of the laser bar assists in conducting heat away from the emitting facet into the heat sink when the laser bar is in operation. Accordingly, the solder securing the laser bar to the heat sink must extend to the end of the laser bar but must not be permitted to rise up on the emitting facet as solder flow up the emitting facet poses the danger of obscuring the light emitted from the active regions of the facet and thereby degrading laser operation. The amount of solder sheet 33 overhang OH 33 may thus be greater than the amount OH 34 by which laser bar 34 overhangs the ends of submount 32 and heat sink 30.

The degree of overhang OH 34 is determined by the difference in diameters of portions 37a and 37c of alignment pin 37. Major diameter 37a is dimensioned to butt against the left-hand edge of heat sink 30, solder preform 31 and submount 32 while the diameter of section 37c is designed to butt against the left-hand end of laser diode bar 34. It is important that section 37c not contact the emitting end of the quantum well portion QW of laser bar 34 as established by dimension d2.

To prevent capillary action obscuring the end of the QW layer, portion 37b of pin 37 is recessed. The height of the recess portion is identified by dimension d1. The depth of the recessed portion is dimensioned to accommodate the solder preform overhand OH 33. Advantageously, the depth of the recess portion is such that solder preform may bottom in the recess when the end of laser bar 34 makes contact with portion 37c of pin 37. When the parts are offset as shown in FIGS. 3 and 4, they may advantageously be held in position by a weight W and/or clamp (not shown) to prevent inadvertent movement until the solder is reflowed and allowed to cool to secure the parts together. When the solder sheets are reflowed in an oven (not shown), the portion of solder sheet 33 overhanging the end of heat sink block 30 will be pulled downward by gravity, toward the end of submount 32, rather than flowing upward by capillary action toward the light emitting facet end of laser diode bar 34. This safeguards the light emitting end of bar 34 from being overrun by molten solder. Thus, in accordance with the invention, the light emitting end of the laser bar is protected from being obscured by molten solder without resort to any shielding or protective coating.

In one illustrative embodiment, the following dimensions were employed:

OH 34=0 to 8 $\mu$ maximum. (Greater than an 8 $\mu$ overhand is not desired since it reduces the conduction of heat transfer away from the emitting facet into the heat sink)

d1=0.010".

OH 33=≈0.001'.

What has been described is deemed illustrative of the principles of the invention. It should be apparent to those skilled in the art that instead of using recessed pin 30 to locate the ends of the laser bar and solder preforms with respect to an edge of the heat sink, as shown in FIGS. 3 and 4, the overhangs may be accomplished with the use of a "pick and place" machine. It should also be apparent that instead of a solder preform, a predeposited solder layer may be used on the submount and/or heatsink with equally advantageous results. Further, pin 30 may be mounted on a carriage that slides away after the laser bar and submount have been positioned and clamped together before the assembly is placed in an oven to reflow the solder.

Further and other modifications will be apparent to those skilled in the art and may be made without, however, departing from the scope of the invention.

What is claimed is:

1. A method of preventing solder from obscuring the light emitting end of a laser bar incident to reflowing the solder to secure the laser bar to a heat sink, comprising the steps of:

placing a sheet of solder on said heat sink, placing said laser diode bar on said sheet of solder, aligning said laser diode bar with an end of said heat sink using a pair of datum pins which make no contact with the emitting portion of said laser bar; and heating said laser diode bar, solder and heat sink to reflow said solder; and allowing said solder to cool to secure said bar to said heat sink.

2. A method according to claim 1 wherein said datum pins are recessed to allow said laser bar to overhang the end of said heat sink.

3. A method according to claim 1 wherein said recess accommodates said sheet of solder overhanging the end of said heat sink.

4. A method according to claim 2 wherein said datum pins are cylindrical having a major diameter against which said heat sink is butted, said pin having a minor diameter against which said laser bar is butted.

5. A method according to claim 4 wherein said solder sheet is bottomed into said recess.

6. A method according to claim 4 wherein said recess is dimensioned so that no part of said pin makes contact with the active region of said laser bar.

7. A method according to claim 4 wherein said alignment pin is made of polished alumina.

8. In combination, an assembly of a laser diode bar and a heat sink, said assembly comprising:

a laser diode bar having parallel surfaces and a facet at one end for emitting light, the emitting portion of said facet lying closer to one surface of said bar;

a heat sink having a soldering surface;

a sheet of solder between said laser diode and said heat sink, said emitting end of said laser diode bar overhanging an end of said heat sink by a predetermined amount sufficient to prevent capillary flow of said solder over said emitting end of said laser sufficient to assembly is heat to reflow said sheet for securing said bar to said heat sink.

* * * * *